(12) United States Patent
Labbe et al.

(10) Patent No.: US 11,444,625 B2
(45) Date of Patent: Sep. 13, 2022

(54) CLOCK PHASE-SHIFTING TECHNIQUES IN PHYSICAL LAYOUT DESIGN

(71) Applicant: Arm Limited, Cambridge (GB)

(72) Inventors: Benoit Labbe, Cambridge (GB); Shidhartha Das, Upper Cambourne (GB); Thanusree Achuthan, Great Cambourne (GB)

(73) Assignee: Arm Limited, Cambridge (GB)

( * ) Notice: Subject to any disclaimer, the term of this patent is extended or adjusted under 35 U.S.C. 154(b) by 11 days.

(21) Appl. No.: 17/103,585

(22) Filed: Nov. 24, 2020

(65) Prior Publication Data

US 2022/0166436 A1    May 26, 2022

(51) Int. Cl.
| | |
|---|---|
| *G06F 1/00* | (2006.01) |
| *H03L 7/081* | (2006.01) |
| *G06F 1/324* | (2019.01) |
| *G06F 1/10* | (2006.01) |
| *H03L 7/085* | (2006.01) |

(52) U.S. Cl.
CPC ............ *H03L 7/0814* (2013.01); *G06F 1/10* (2013.01); *G06F 1/324* (2013.01); *H03L 7/085* (2013.01)

(58) Field of Classification Search
CPC ......... H03L 7/0814; H03L 7/085; G06F 1/10; G06F 1/324
See application file for complete search history.

(56) References Cited

U.S. PATENT DOCUMENTS

| | | | | |
|---|---|---|---|---|
| 10,686,582 | B1 * | 6/2020 | Pasdast | H03L 1/00 |
| 2004/0183613 | A1 * | 9/2004 | Kurd | G01K 7/32 |
| | | | | 331/186 |
| 2007/0176657 | A1 * | 8/2007 | Byun | H03K 5/13 |
| | | | | 327/158 |
| 2012/0187991 | A1 * | 7/2012 | Sathe | H03K 5/135 |
| | | | | 327/158 |

\* cited by examiner

*Primary Examiner* — Nitin C Patel
(74) *Attorney, Agent, or Firm* — Pramudji Law Group PLLC; Ari Pramudji (57) ABSTRACT

Various implementations described herein are related to a device. The device may include first circuitry that receives a clock signal and provides one or more phase-shifted pulse signals based on the clock signal. The device may include second circuitry that receives an input voltage, receives the clock signal, and provides an internal control signal based on the input voltage and the clock signal. The device may include third circuitry that receives the internal control signal, receives the one or more phase-shifted pulse signals, and provides an output clock signal based on the internal control signal and the one or more phase-shifted pulse signals.

17 Claims, 6 Drawing Sheets

CLOCK PHASE-SHIFTING TECHNIQUES IN PHYSICAL LAYOUT DESIGN

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some modern computing architecture designs, logic that is used to generate a clock for a processor or other digital circuit typically involves deficient voltage margins of a digital timing supply by failing to adjust the operating clock when substantial voltage transients occur. These detrimental voltage transients typically create timing errors in the processor and often adversely impact and/or alter the processor's capabilities, operations and performance. Thus, conventional computing circuitry typically operates at higher than necessary voltage much of the time, which adds to significant power dissipation. As such, there exists a need to improve conventional computing designs so as to improve timing latency, performance inefficiencies, and power dissipation in many applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to clock phase-shifting architecture in physical layout design. For instance, various clock phase-shifting schemes and techniques described herein provide for rotating phase selector circuitry for intelligent clock stretching of high-performance digital circuits. In various implementations, a flexible clocking circuit may be utilized to generate a regulated clock for a central processing unit (CPU), a graphics processing unit (GPU), or some other similar digital circuit, wherein the generated CPU/GPU clock allows for a reduction of voltage margin of the digital supply by automatically slowing down the CPU/GPU clock when a substantial voltage transient occurs. By lowering CPU/GPU clock frequency when a voltage droop starts occurring, the CPU/GPU current drops to thereby ease the strain on the power delivery network (PDN) of the CPU/GPU and reduce overall voltage droop. The constant added supply voltage margin may therefore be reduced by diminution of transient voltage droop, which reduces overall circuit power dissipation (causing a lower supply voltage) by momentarily reducing digital circuit speed (i.e., CPU/GPU frequency) without degradation of a user's experience in some computing based applications.

In some implementations, the clock phase-shifting architecture may provide for a digital locked loop that provides pulse signals with shifted phases, and the clock phase-shifting architecture may provide for a droop detector that detects voltage droop in a core voltage signal and provides an internal control signal based on detecting the voltage droop in the core voltage signal. The clock phase-shifting architecture may provide for a phase shifter (i.e., mask, filter or combiner) that receives the internal control signal from the droop detector, receives the pulse signals from the digital locked loop, stretches frequency of the internal control signal via rotating phase selection of the shifted phases of the pulse signals, and then provides an output clock signal based on the stretched frequency of the internal control signal. In some instances, the pulse signals refer to multiple consecutive phase-shifted pulse signals with each phase-shifted pulse signal having a shifted phase with respect to each other phase-shifted pulse signal.

In some implementations, the clock phase-shifting architecture may provide for a phase locked loop that receives a reference clock from an external clocking source, generates a phase locked loop clock signal, and provides the phase locked loop clock signal to the digital locked loop. The droop detector may receive the core voltage signal from an external supply, receive the phase locked loop clock signal from the phase locked loop, generate the internal control signal based on the core voltage signal and the phase locked loop clock signal, and provide the internal control signal to the phase shifter. The digital locked loop may receive the phase locked loop clock signal from the phase locked loop, generate the pulse signals with the shifted phases based on the phase locked loop clock signal, and provide the pulse signals as phase-shifted pulse signals to the phase shifter. Moreover, the clock phase-shifting architecture may also provide for a post scalar output circuit that receives the output clock signal from the phase shifter, generates a scaled output clock signal based on the output clock signal, and then provides the scaled output clock signal to an external computing device.

Various implementations of clock phase-shifting architecture along with various clock phase-shifting schemes and techniques related thereto will be described in greater detail herein with reference to FIGS. 1-6.

Figure 1:
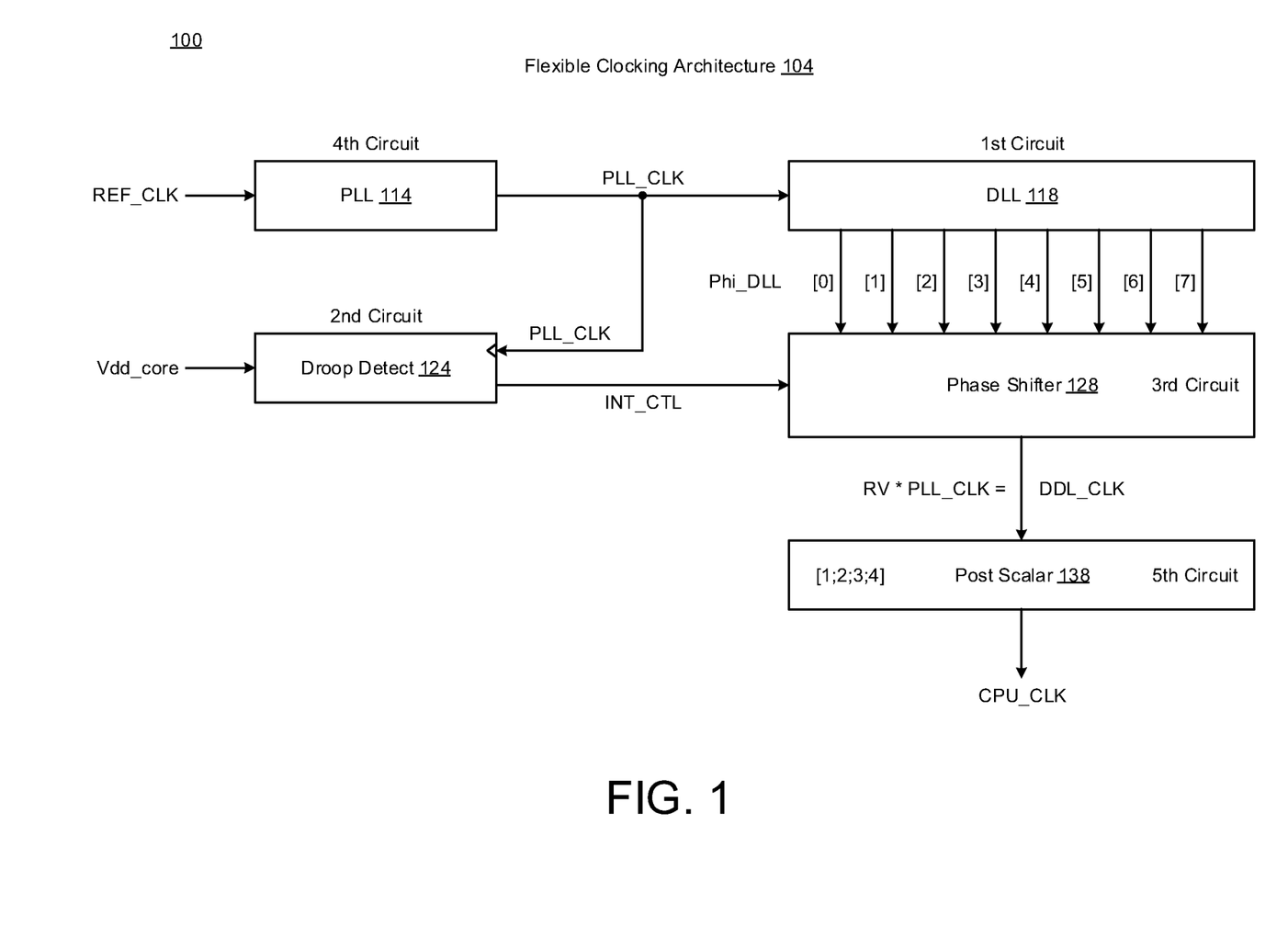
FIG. 1 illustrates a diagram of flexible clocking architecture in accordance with various implementations described herein.

FIG. 1 illustrates a diagram 100 of flexible clocking architecture 104 with clock phase-shifting circuitry in accordance with implementations described herein.

In various implementations, the clocking architecture 104 may be implemented as a system or a device having integrated circuit (IC) components that are arranged and coupled together as an assemblage or combination of parts that provide for physical circuit designs and related structures. In some instances, a method of designing, providing and building the clocking architecture 104 as an integrated system or device may involve use of various IC circuit components described herein so as to implement clock phase-shifting schemes and techniques associated therewith. Also, the clocking architecture 104 may be integrated with computing circuitry and related components on a single chip, and the clocking architecture 104 may be implemented in various embedded systems for various automotive, electronic, mobile, server and Internet-of-things (IoT) applications.

As shown in FIG. 1, the flexible clocking architecture 104 may refer to multi-stage circuitry having various circuits that are coupled together to perform various logical and timing related behaviors. For instance, in some implementations, the flexible clocking architecture 104 may be configured to generate a CPU_CLK signal from a reference clock signal (REF_CLK) and then modulate the output frequency of the CPU_CLK according to changes in the supply voltage (Vdd_core) of the CPU, GPU or similar digital circuit. Also, in some instances, the CPU_CLK may refer to a GPU clock (GPU_CLK) for applications involving a graphics processing unit (GPU) or similar digital processing circuitry.

The flexible clocking architecture 104 may have first circuitry 118 that receives a clock signal (PLL_CLK) and provides one or more phase-shifted pulse signals (Phi_DLL [0]-[7]) based on the clock signal (PFF_CLK). The first circuitry 118 may refer to a digital locked loop (DLL) circuit that receives the clock signal (PFF_CLK) as a phase locked loop (PLL) clock signal. In some instances, the phase-locked loop (PLL) circuit 114 generates a high frequency clock base signal (PLL_CLK) from a lower frequency reference oscillator signal (REF_CLK), and this high frequency clock base signal (PLL_CLK) feeds a digital locked loop (DLL) circuit 118 that tracks the PLL output and generates phase-shifted clock outputs, Phi_DLL[7:0]. Also, a voltage monitoring circuit (e.g., droop detect 124) monitors the CPU core voltage (Vdd_core) at the high frequency clock base signal (PLL CLK) and also detects any voltage droop on the CPU core voltage (Vdd_core).

The flexible clocking architecture 104 may have second circuitry 124 (the droop detect) that receives an input voltage (Vdd_core), receives the clock signal (PLL_CLK), and provides an internal control signal (INT_CTL) based on the input voltage (Vdd_core) and the clock signal (PLL_CLK). The second circuitry 124 may refer to a droop detection circuit (droop detect circuit) that receives the input voltage (Vdd_core) as a core voltage and then provides the internal control signal (INT_CTL) as a digital internal control signal having a number (n) of digital internal control signals [n:0]. Moreover, in some instances, the internal control signal (INT_CTL) may refer to one or more time-to-digital conversion signals, such as, e.g., tdc[n:0] signals.

The flexible clocking architecture 104 may have third circuitry 128 that receives the internal control signal (INT_CTL), receives the one or more phase-shifted pulse signals (Phi_DLL [0]-[7]), and provides an output clock signal (DLL_CLK) based on the internal control signal (INT_CTL) and the one or more phase-shifted pulse signals (Phi_DLL [0]-[7]). The third circuitry 128 may refer to a phase shifter circuit that provides the output clock signal (DLL_CLK) as a digital output clock signal. In some instances, the flexible clocking architecture 104 operates to combine the DLL phases Phi_DLL[0:7] from the DLL 118 and also uses the phase shifter circuit 128 to generate the digital output clock (DDL_CLK) according to the droop detect output signal (INT_CTL). As such, the flexible clocking architecture 104 operates to select a phase that sets and resets an internal SR latch that is configured to generate the digital output clock (DDL_CLK), while maintaining timing conditions during operation of logic gates and operating within a single cycle.

The flexible clocking architecture 104 may have fourth circuitry 114 (i.e., phase locked loop circuit) that receives a reference clock (REF_CLK) from an external source, generates the phase locked loop clock signal (PLL_CLK), and then provides the phase locked loop clock signal (PLL_CLK) to the digital locked loop circuit 118. Also, the fourth circuitry 114 may refer to a phase locked loop (PLL) circuit that receives the reference clock (REF_CLK), generates the phase locked loop clock signal (PLL_CLK), and then provides the phase locked loop clock signal (PLL_CLK).

In some implementations, the droop detection circuit 124 may be configured to receive the core voltage (Vdd_core) from an external supply, receive the phase locked loop clock signal (PLL_CLK) from the phase locked loop circuit 114, and then generate the digital internal control signal (INT_CTL) based on the core voltage (Vdd_core) and the phase locked loop clock signal (PLL_CLK). Further, the droop detection circuit 124 may also be configured to provide the digital internal control signal (INT_CTL) to the phase shifter circuit 128.

In various implementations, the phase shifter circuit 128 may be configured to operate as a rotating phase selector for intelligent clock stretching of high performance digital circuits. Also, the one or more phase-shifted pulse signals (Phi_DLL [0]-[7]) may refer to multiple phase-shifted pulse signals with each phase-shifted pulse signal having a shifted phase with respect to each other phase-shifted pulse signal.

The flexible clocking architecture 104 may have fifth circuitry 138 that receives the digital output clock signal (DLL_CLK) from the phase shifter circuit 128, generates a scaled digital output clock signal (CPU_CLK) based on the digital output clock signal (DLL_CLK), and provides the scaled digital output clock signal (CPU_CLK) to an external computing device. The fifth circuitry 138 refers to a post scalar output circuit that receives the digital output clock signal (DLL_CLK), generates the scaled digital output clock signal (CPU_CLK), and then provides the scaled digital output clock signal (CPU_CLK) to the external computing device. The digital output clock signal (DLL_CLK) may be calculated as a product (*) of a ratio value (RV) multiplied with the phase locked loop clock signal (PLL_CLK), wherein DLL_CLK=RV*PLL_CLK. In some instances, the ratio value (RV) may refer to at least one of value associated with 1.0, 0.8, 0.66, 0.57, 0.5.

In various implementations, the external computing device refers to a processor for use with a central processing unit (CPU) and/or a graphics processing unit (GPU), and the scaled digital output clock signal (CPU_CLK) may refer to a CPU clock signal for the processor and/or CPU/GPU. The flexible clocking circuitry 104 may operate as a device that is configured to generate the CPU clock signal for the CPU (or GPU) that allows for reduction of a voltage margin of the core voltage by automatically slowing down the CPU clock when a large voltage transient occurs in the core voltage. The flexible clocking circuitry 104 may operate as a device that is configured to lower a clock frequency of the CPU clock when a voltage droop starts to occur in the core voltage, and when current to the CPU drops, the device reduces the voltage droop in the core voltage. Also, the flexible clocking circuitry 104 may operate as a device that is configured to momentarily reduce digital circuit speed of the CPU/GPU by lowering clock frequency of the CPU clock when a voltage droop occurs in the core voltage.

In some implementations, the flexible clocking architecture 104 may provide for an adaptive clock generation circuit for high performance CPUs and/or high performance CPUs GPUs, and also, the flexible clocking architecture 104 may use various circuitry that is configured for automatic clock stretching when a supply voltage droop is detected. Also, the flexible clocking architecture 104 may have various circuitry that is configured to select at least one specific CPU/GPU clock phase among multiple phase-shifted clock phases to dynamically stretch the CPU/GPU clock for a digital system (e.g., CPU, GPU or similar) when a voltage droop occurs. One point of novelty of this circuitry refers to its capability to perform clock stretching with little to no latency while maintaining timing requirements for various latches and/or flip-flops in the circuitry. Another point of novelty of this circuitry refers to its capability of double-buffering operations when operating on the various phase shifts of the clock signal that allows little to no delay in clock stretching operations.

Figure 2:
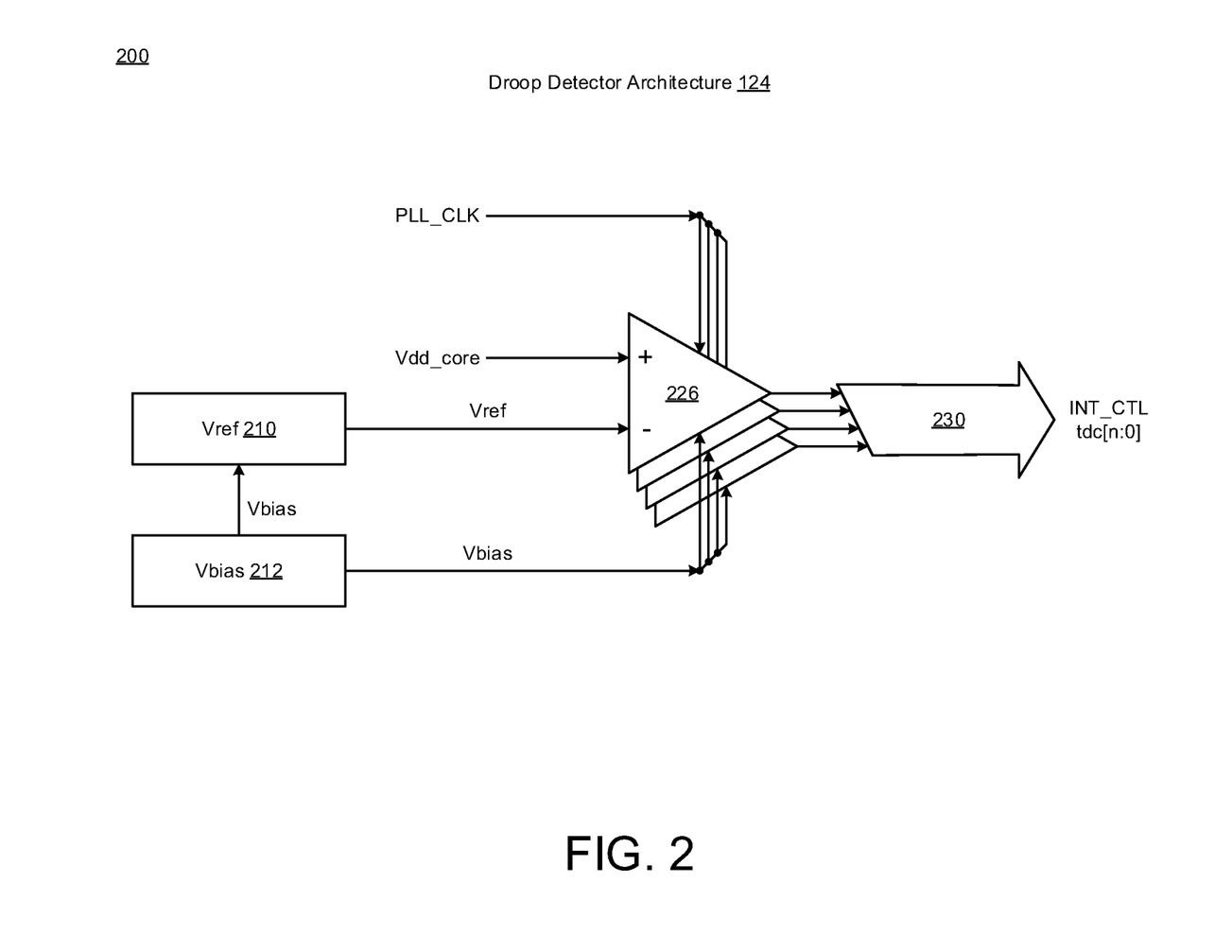
FIG. 2 illustrates a diagram of droop detector architecture in accordance with various implementations described herein.

FIG. 2 illustrates a schematic diagram 200 of the droop detector architecture 124 in accordance with various implementations described herein.

In various implementations, the droop detector architecture 124 may refer to a system or device having integrated circuit (IC) components that are arranged and coupled together as an assemblage or combination of parts that provide for physical circuit designs and related structures. In some instances, a method of designing, providing and building the droop detector architecture 124 as an integrated system or device may involve use of various IC circuit components described herein so as to implement clock phase-shifting schemes and techniques associated therewith. Also, the droop detector architecture 124 may be integrated with computing circuitry and related components on a single chip, and the droop detector architecture 124 may be used in various embedded systems for various automotive, electronic, mobile, server and Internet-of-things (IoT) applications.

As shown in FIG. 2, the droop detector architecture 124 may include various components, such as, e.g., voltage reference circuitry 210, voltage bias circuitry 212, and one or more operational amplifiers (Op Amps) 226. In some implementations, the voltage reference circuitry 210 may provide a voltage reference signal (Vref) to the one or more operational amplifiers 226 based on a voltage bias signal (Vbias). Also, the voltage bias circuitry 212 may provide the voltage bias signal (Vbias) to the voltage reference circuitry 210 and to the one or more operational amplifiers 226.

In various implementations, each of the one or more operational amplifiers 226 may be configured to receive the input core voltage (Vdd_core) at a non-inverting input (+), receive the voltage reference signal (Vref) at an inverting input (−), receive the clock signal (PLL_CLK) at a first (positive) power connection, and also receive the voltage bias signal (Vbias) at a second (negative) power connection. Also, the one or more operational amplifiers 226 may provide an output signal 230 based on the inputs signals (Vdd_core, Vref, PLL_CLK, Vbias). In some instances, the droop detector architecture 124 operates as a time-to-digital converter (TDC) that may provide the output signal 230 as the internal control signal (INT_CTL), which may refer to the one or more tdc[n:0] signals.

Figure 3:
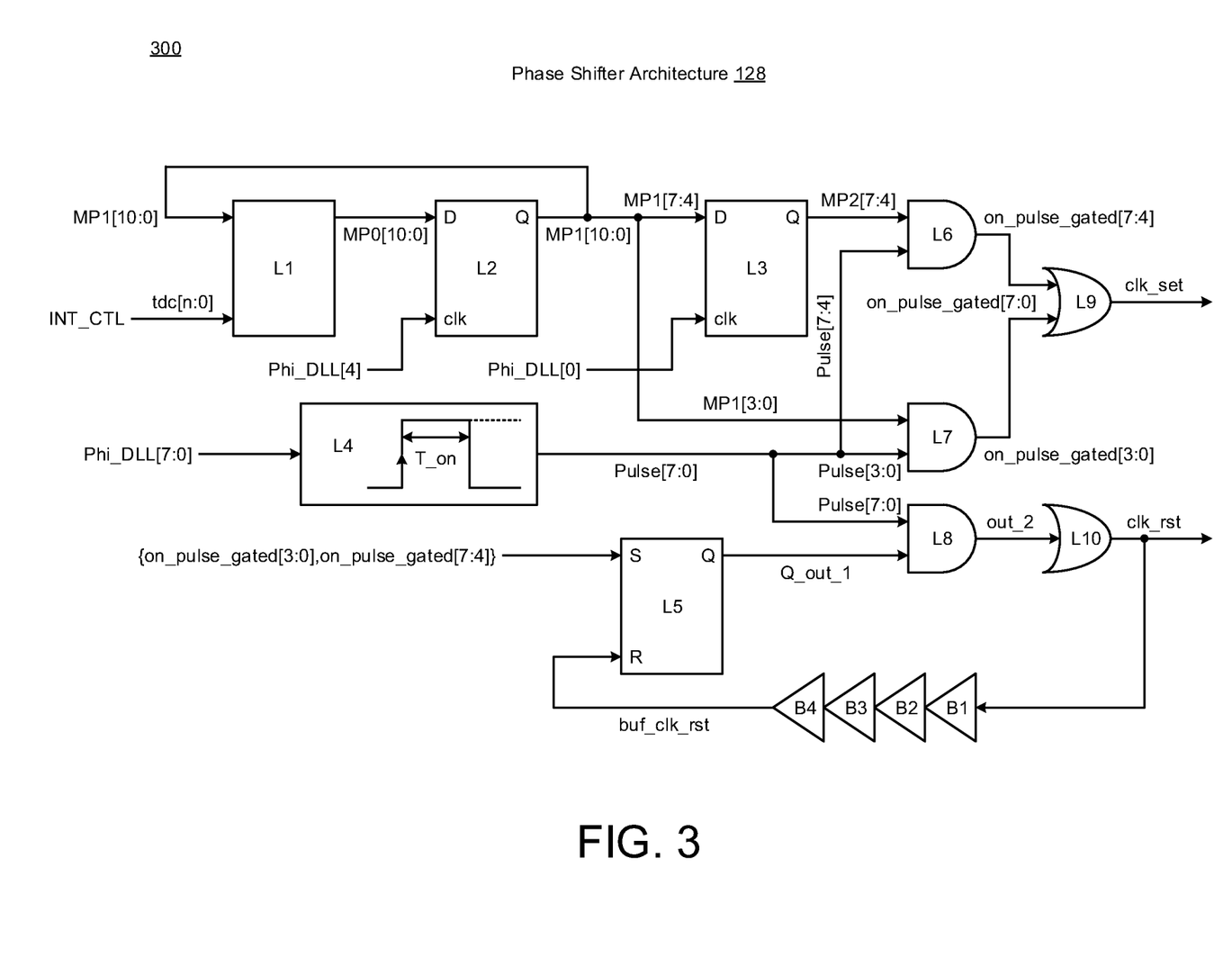
FIG. 3 illustrates a diagram of phase shifter architecture in accordance with various implementations described herein.

FIG. 3 illustrates a schematic diagram 300 of the phase shifter architecture 128 in accordance with various implementations described herein.

In various implementations, the phase shifter architecture 128 may refer to a system or device having integrated circuit (IC) components that are arranged and coupled together as an assemblage or combination of parts that provide for physical circuit designs and related structures. In some instances, a method of designing, providing and building the phase shifter architecture 128 as an integrated system or device may involve use of various IC circuit components described herein so as to implement clock phase-shifting schemes and techniques associated therewith. Also, the phase shifter architecture 128 may be integrated with computing circuitry and related components on a single chip, and the phase shifter architecture 128 may be used in various embedded systems for various automotive, electronic, mobile, server and Internet-of-things (IoT) applications.

As shown in FIG. 3, the phase shifter architecture 128 may have various logic circuits, such as, e.g., logic L1-L10. In some implementations, first logic (L1) may receive the tdc[n:0] signal from the droop detector 124, receive a feedback signal MP1[10:0], and provide an output signal MP0[10:0]. Also, second logic (L2) may receive the output signal MP0[10:0] from the first logic (L1), receive the Phi_DLL[4] signal from the DLL 138 as a clock signal (clk), and provide an output signal MP1[10:0], and the second logic (L2) may operate as a data latch, such as, e.g., a D flip-flop (DFF). Also, the second logic (L2) may provide the output signal MP1[10:0] to the first logic (L1) as a feedback signal. Moreover, third logic (L3) may receive a first part MP1[7:4] of the output signal MP1[10:0] from the second logic (L2), receive the Phi_DLL[0] signal from the DLL 138 as a clock signal (clk), and provide an output signal MP2[7:4], and the third logic (L3) may operate as a data latch, such as, e.g., a D flip-flop (DFF).

In some implementations, fourth logic (L4) may receive the Phi_DLL[7:0] signal from the DLL 118 and provide one or more pulse signals, such as, e.g., Pulse[7:0]. Also, sixth logic (L6) may receive the output signal MP2[7:4] from the third logic (L3), receive a first part Pulse[7:4] of the pulse signals Pulse[7:0] from the fourth logic (L4), and provide a first on_pulse_gated signal [7:4]. Also, seventh logic (L7) may receive a second part MP1[3:0] of the output signal MP1[10:0] from the second logic (L2), receive a second part Pulse[3:0] of the pulse signals Pulse[7:0] from the fourth logic (L4), and provide a second on_pulse_gated signal [3:0]. Also, ninth logic (L9) may receive the first on_pulse_gated signal [7:4] from the sixth logic (L6), receive the second on_pulse_gated signal [3:0] from the seventh logic (L7), and provide a clock set signal (clk_set).

In some implementations, fifth logic (L5) may receive the first on_pulse_gated signal [7:4] from the sixth logic (L6) and/or receive the second on_pulse_gated signal [3:0] from the seventh logic (L7) at a first input (S), and the fifth logic (L5) may receive a buffered clk_rst signal (buf_clk_rst) at a second input (R). Also, the fifth logic (L5) may provide an output signal (Q_out_1) based on the S and R input signals, and the fifth logic (L5) may operate as an SR latch. Also, eighth logic (L8) may receive pulse signals Pulse[7:0] from the fourth logic (L4), receive the Q_out_1 signal from the fifth logic (L5), and then provide an output signal (out_2). Also, tenth logic (L10) may receive the out_2 signal from the eighth logic (L8) and provide a clock reset signal (clk_rst). Also, a series of buffers (B1-B4) may receive the clk_rst signal from the tenth logic (L10) and then provide the buffered clk_rst signal (buf_clk_rst) to the second input (R) of the fifth logic (L5).

In various implementations, the logic L1-L10 may be implemented with various types of logic circuitry, such as, e.g., latches, NAND gates, NOR gates, buffers, etc. For instance, second logic (L2) and third logic (L3) may be implemented with data latches, such as, e.g., D flip-flops (DFFs), and fifth logic (L5) may be implemented with a set-reset latch, such as, e.g., an SR latch. Also, logic (L6, L7, L8) may be implemented with NAND gates, and logic (L9, L10) may be implemented with NOR gates. Moreover, buffers (B1-B4) may be used along with various other logic circuitry (L1 and L4). However, various other logic configurations may be used to achieve similar results.

In some implementations, in reference to FIG. 3, the logic (L1-L4, L6-L7, L9) are arranged and configured to provide for clk_set signal generation with double-buffering of the mask. The logic (L1-L4, L6-L7, L9) may be configured to implement a function that determines which phase will be selected on the next phase rotation as a function of the current selected phase and the droop detection circuit output tdc[n:0]. The phase rotation speed may refer to a combinatory function (e.g., phase_shift_speed) that accounts for the output of the droop detector 124 and the current mask value. If the tdc output records no voltage droop, and there is no need for skipping a cycle (e.g., mask_phi1[10:8]), then no rotation is necessary. Depending on the phase shift necessary, the mask shifter/combiner 128 may operate as a barrel shifter that phase-shifts by as many bits as necessary, and to avoid multiple phase rotation skipping, once an active bit is in place of the reservoir bits (e.g., bits 8 to 10), the active bit may be shifted to bit 0. In some instances, this operation refers to various phase-shift speeds.

Figure 4:
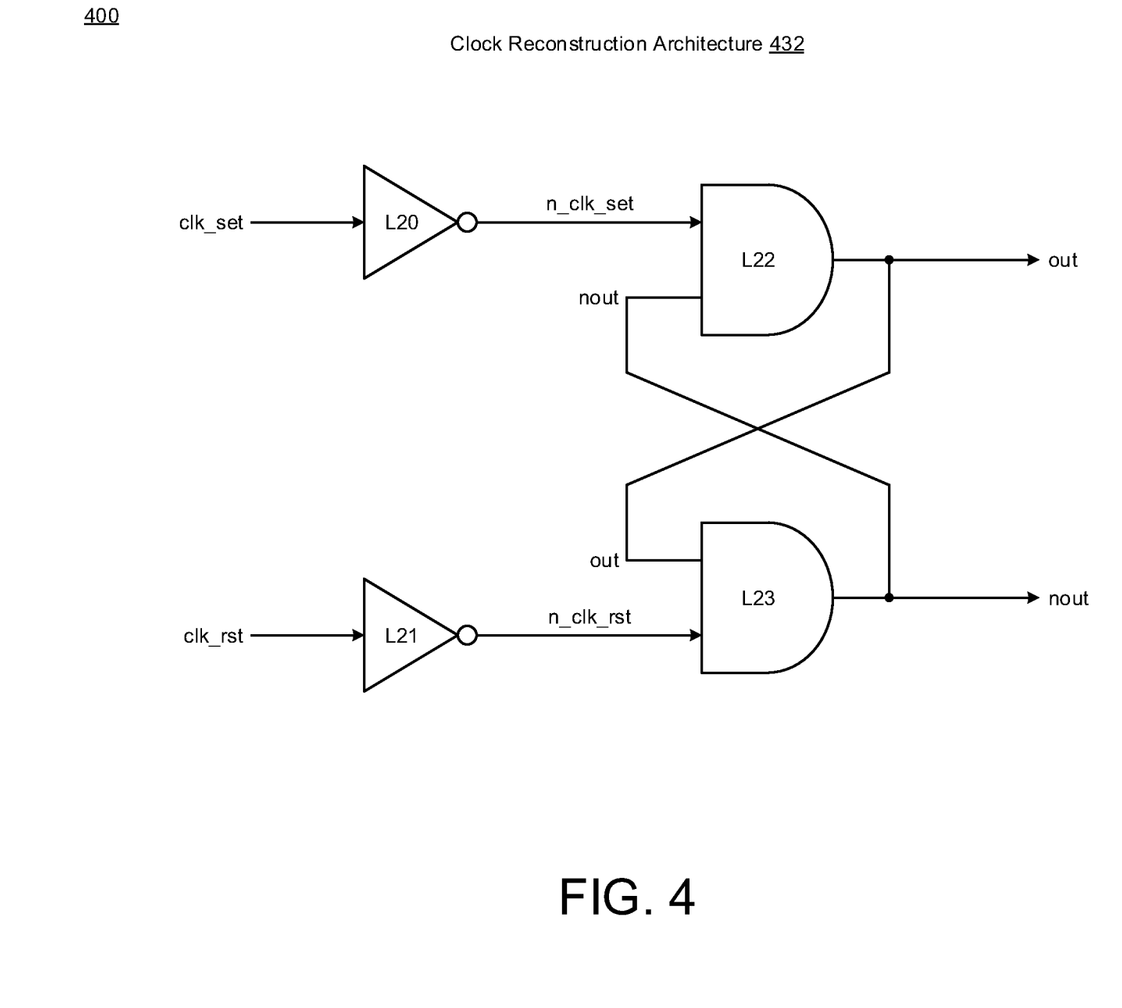
FIG. 4 illustrates a diagram of clock reconstruction architecture in accordance with various implementations described herein.

FIG. 4 illustrates a logic diagram 400 of clock reconstruction architecture 432 in accordance with various implementations described herein.

In various implementations, the clock reconstruction architecture 432 may refer to a system or device having integrated circuit (IC) components that are arranged and coupled together as an assemblage or combination of parts that provide for physical circuit designs and related structures. In some instances, a method of designing, providing and building the clock reconstruction architecture 432 as an integrated system or device may involve use of various IC circuit components described herein so as to implement clock phase-shifting schemes and techniques associated therewith. The clock reconstruction architecture 432 may be integrated with computing circuitry and related components on a single chip, and also, the clock reconstruction architecture 432 may be used in embedded systems for various automotive, electronic, mobile, server and IoT applications.

As shown in FIG. 4, the clock reconstruction architecture 432 may have logic circuits, such as, e.g., logic L20-L23. In some implementations, logic (L20) may receive the clk_set signal from the phase shifter architecture 128 and provide a complementary clk_set signal (n_clk_set) to logic (L22) as an input signal. Also, logic (L21) may receive the clk_rst signal from the phase shifter architecture 128 and provide a complementary clk_rst signal (n_clk_rst) to logic (L23) as an input signal. Also, logic (L22) may receive the n_clk_set signal from the logic (L21), receive an output signal (nout) from logic (L23) and provide an output signal (out). Moreover, logic (L23) may receive the n_clk_rst signal from the logic (L22), receive the output signal (out) from logic (L22) and provide the output signal (nout). The output signal (out) from logic (L22) may refer to a feedback signal that is fed back to an input of logic (L23), and also, the output signal (nout) from logic (L23) may refer to another feedback signal that is fed back to an input of logic (L22).

In various implementations, the logic L20-L23 may be implemented with various types of logic circuits, such as, e.g., AND gates, inverters, buffers, etc. For instance, logic (L20 and logic (L21) may be implemented with one or more inverters and/or buffers. Also, logic (L22) and logic (L23) may be implemented with AND gates. However, various other logic configurations may be used to achieve similar results.

Figure 5:
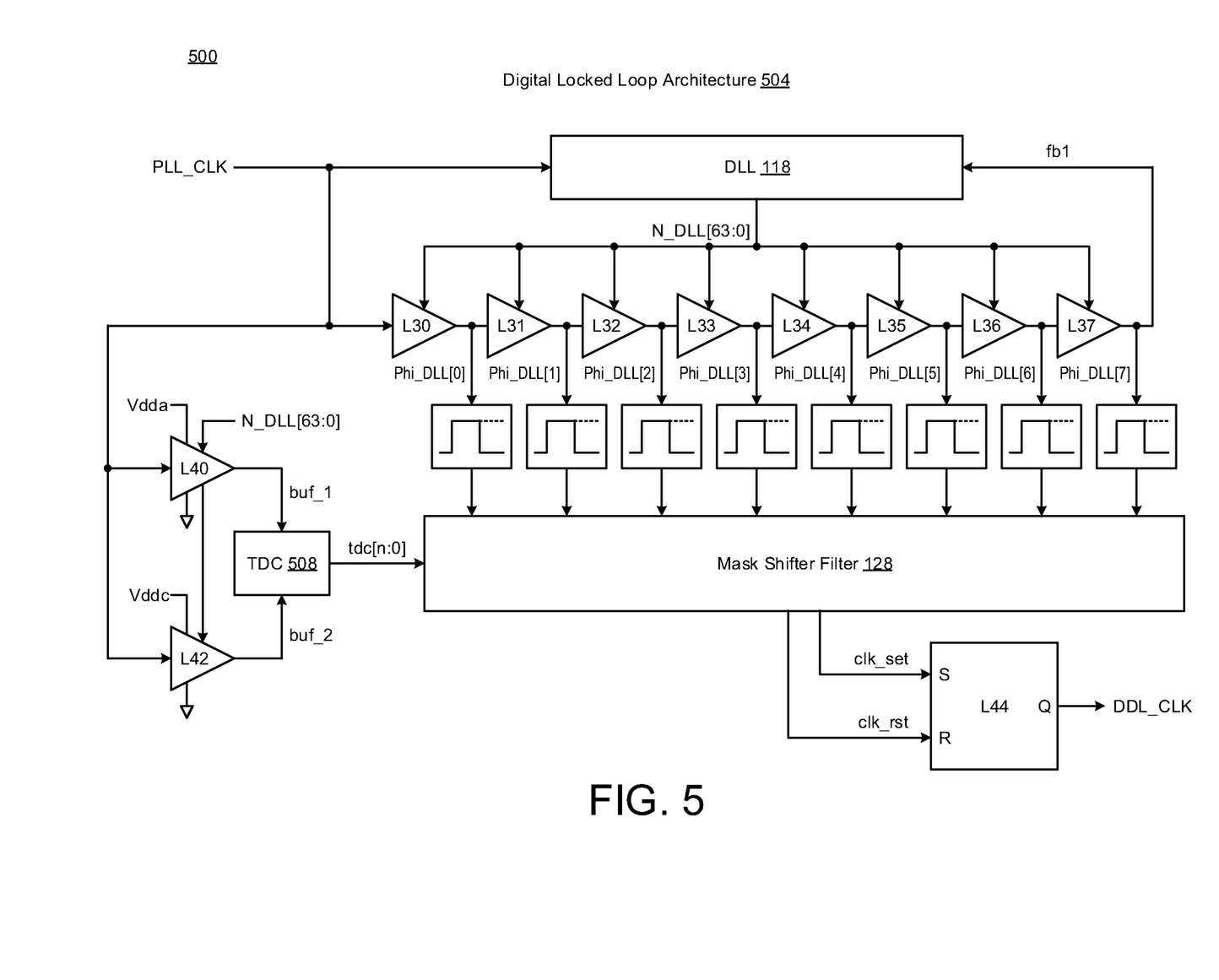
FIG. 5 illustrates a diagram of digital locked loop architecture in accordance with various implementations described herein.

FIG. 5 illustrates a schematic diagram 500 of digital locked loop architecture 504 in accordance with various implementations described herein.

In various implementations, the digital locked loop (DLL) architecture 504 may refer to a system or a device having integrated circuit (IC) components that are arranged and coupled together as an assemblage or combination of parts that provide for physical circuit designs and various related structures. In some instances, a method of designing, providing and building the digital locked loop architecture 504 as an integrated system or device may involve use of the various IC circuit components described herein so as to implement clock phase-shifting schemes and techniques associated therewith. Also, the digital locked loop architecture 504 may be integrated with computing circuitry and related components on a single chip, and also, the digital locked loop architecture 504 may be used in various embedded systems for various automotive, electronic, mobile, server and Internet-of-Things (IoT) applications, including remote sensor nodes.

As shown in FIG. 5, the digital locked loop (DLL) architecture 504 may include various logic circuitry, such as, e.g., one or more of the DLL 118, logic L30-L37, logic L40-L42, TDC 508, mask shifter filter logic (or phase shifter) 128, and logic (L44). In various implementations, the DLL 118 may receive the PLL_CLK signal, receive a feedback signal (fb1) from the series of buffers (L30-L37), and provide a DLL signal N_DLL[63:0] to power supply connections of the series of buffers (L30-L37). Also, in some instances, the series of buffers (L30-L37) may refer to buffer logic gates that are linked together in series, one after another. For instance, first buffer logic (L30) receives the PLL_CLK signal, receives the N_DLL[63:0] signal from the DLL 118, and provides a pulse signal as output to a next buffer logic (L31) and also to the mask shifter filter 128, which may be referred to as phase shifter logic. Also, each buffer logic (L31-L37) may receive an output pulse signal from a previous buffer logic, receive the N_DLL[63:0] signal from the DLL 118, and then provides an output pulse signal to a next buffer logic and to the mask shifter filter 128. Also, a last buffer logic (e.g., L37) may provide a last output pulse signal to the DLL 118 as a feedback signal. Moreover, the mask shifter filter 128 receives the multiple pulse signals from each of the buffer logic (L30-L37) as multi-signal inputs.

In various implementations, the DLL architecture 504 utilizes a phase-shifted clock, wherein a large number of shifted-phases provides for increased granularity when stretching the input clock. As shown in FIG. 5, eight (8) phases are used for granularity stretching; however, in other instances, four (4) phases may be used. Also, multi-phase generation from a single phase may be architecture agnostic, wherein various different types of DLLs may be used, such as, e.g., (AD)DLL, (AD)PLL and/or (AD)FLL. Moreover, in some instances, phase noise and/or jitter may constrain the solution space.

In some implementations, buffer logic (L40) may receive the PLL_CLK signal as input, receive a reference voltage supply (Vdda) from an external source, receive the N_DLL [63:0] signal from the DLL 118, and then provide a first buffered signal (buf_1) to the TDC 508. The buffer logic (L42) may receive the PLL_CLK signal as input, receive a core voltage supply (Vddc) from an external source, receive the N_DLL[63:0] signal from the DLL 118, and then provide a second buffered signal (buf_2) to the TDC 508. Also, in some instances, the TDC 508 may provide the internal control signal (INT_CTL), such as, e.g., the tdc[n:0] signal, to the mask shifter filter 128 based on the buffered signals (buf_1, buf_2). Moreover, the mask shifter filter 128 receives the multiple pulse signals from each of the buffer logic (L30-L37), receives the tdc[n:0] signal from the TDC 508, and provides the clock set signal (clk_set) and/or the clock reset signal (clk_rst) to logic (L44). In some instances, the logic (L44) may be implemented as an SR latch that receives the clk_set signal, receives the clk_rst signal, and provides the digital locked loop clock signal (i.e., DLL_CLK signal) as a digital output clock signal from the DLL architecture 504.

In some implementations, the architecture of the DLL circuit 118 combined with the droop detector 124 and the phase shifter/combiner 128 (i.e., mask shifter filter) refers to a novel flexible clocking architecture. The digital delay line (DDL) may be set to track a period of the PLL_CLK, and as such, the DDL output signals (DDL_CLK) may refer to the PLL_CLK signals being shifted by a fraction of the PLL_CLK period. For instance, an 8 phase DLL is presented in FIG. 5, and with 4 GHz operation, the PLL_CLK period is 250 ps, and each phase may be delayed by 31.25 ps from a previous phase.

Also, in some implementations, each shifted phase generates and on-pulse on its rising edge, and the on-pulse may be designed to maintain a specific set and reset of an SR latch or flip-flop. The mask shifter/combiner 128 may select an on-pulse to set the SR latch and also select another phase shifted by 180° to reset the SR latch. If the droop detector output signal tdc[n:0] detects voltage droop in the core voltage (Vdd_core), then the mask shifter/combiner 128 may select a pulse delayed by an arbitrary number of shifts, wherein the number of phase-shifts may be proportional to twice the tdc[n:0] output. For instance, if the mask shifter/combiner 128 selects output Phi_DDL[0] for a cycle (Nc), and the tdc output is at 1, then the mask shifter/combiner 128 may select output Phi_DDL[2] for a next cycle (Nc+1), thereby making the period between the edge of cycle (Nc) and the rising edge of cycle (Nc+1) longer by one 4th of a period, e.g., for a 4 GHz PLL_CLK frequency, the particular cycle may refer to a 3.2 GHz cycle.

Figure 6:
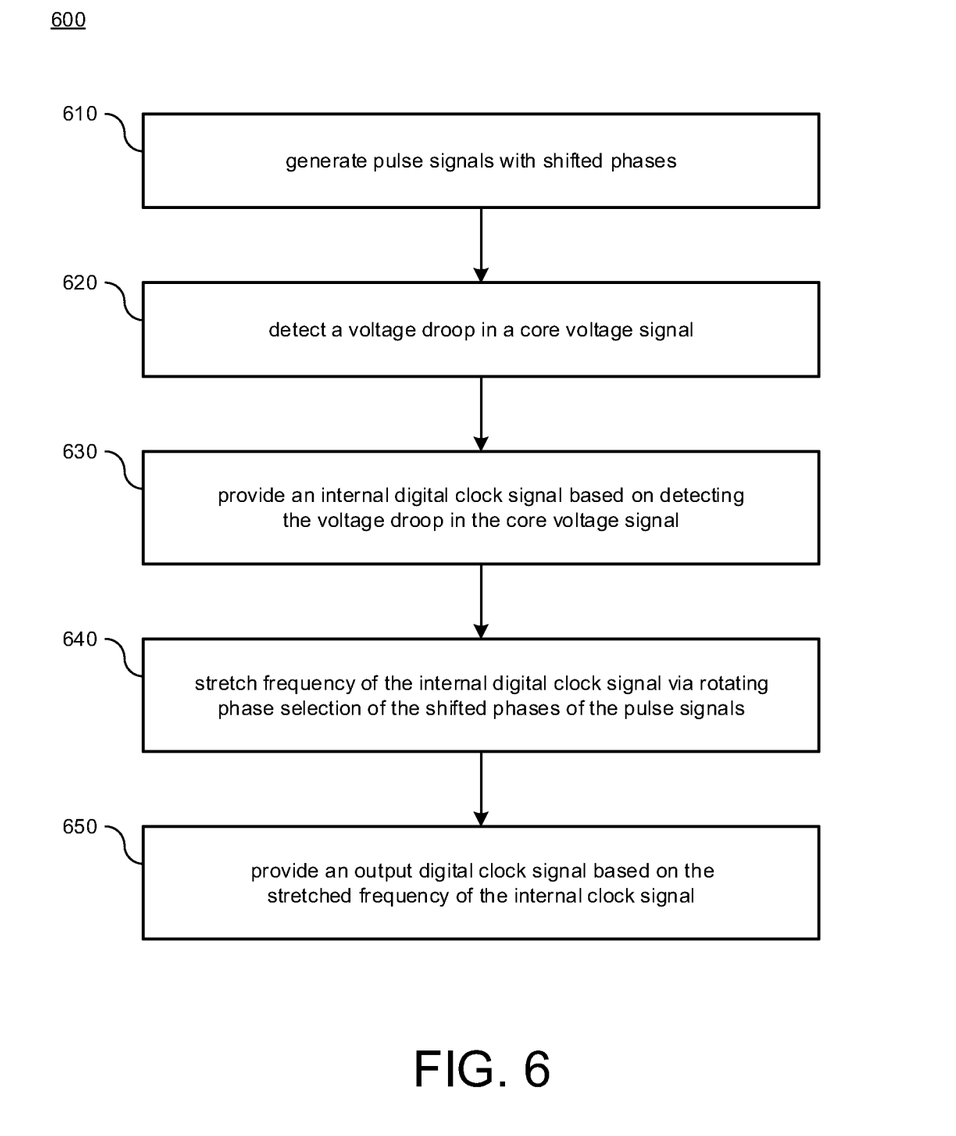
FIG. 6 illustrates a process flow diagram of a method for clock phase-shifting in accordance with various implementations described herein.

FIG. 6 illustrates a process diagram of a method 600 for clock phase-shifting in accordance with various implementations described herein. In some implementations, the method 600 may be configured for providing flexible clocking architecture that utilizes clock phase-shifting circuitry for implementing various clock phase-shifting schemes and techniques as described herein above in reference to FIGS. 1-5.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5. Also, if implemented in software, the method 600 may be implemented as a program and/or software instruction process configured for providing various clock phase-shifting schemes and techniques, as described herein. Moreover, if implemented in software, various instructions related to implementing method 600 may be stored in memory and/or a database. For instance, various types of computing devices having a processor and memory may be configured to perform method 600.

In various implementations, the method 600 may refer to a method of designing, providing, building, fabricating and/or manufacturing backside power rail architecture as an integrated system, device and/or circuit that may involve use of the various IC circuit components described herein so as to implement clock phase-shifting schemes and techniques associated therewith. In some implementations, the clock phase-shifting architecture may be integrated with computing circuitry and other related components on a single chip, and the clock phase-shifting architecture may be implemented with various embedded systems for automotive, electronic, mobile, server and Internet-of-things (IoT) applications, including remote sensor nodes.

At block 610, method 600 may generate one or more pulse signals with shifted phases. In some instances, the one or more pulse signals refer to multiple consecutive phase-shifted pulse signals with each phase-shifted pulse signal having a shifted phase with respect to each other phase-shifted pulse signal. At block 620, method 600 may detect a voltage droop in a core voltage signal, and at block 630, method 600 may provide an internal digital clock signal based on detecting the voltage droop in the core voltage signal. Moreover, at block 640, method 600 may stretch frequency of the internal digital clock signal via rotating phase selection of the shifted phases of the pulse signals, and at block 650, method 600 may provide an output digital clock signal based on the stretched frequency of the internal control signal.

In some implementations, method 600 may include generating a phase locked loop clock signal based on a reference clock signal, and also, method 600 may include generating the internal digital clock signal based on the core voltage signal and the phase locked loop clock signal. Moreover, method 600 may include generating the pulse signals with the shifted phases based on the phase locked loop clock signal, and also, method 600 may include generating a scaled output digital clock signal based on the output digital clock signal for an external computing device.

The various schemes and techniques described herein provide advantages in physical layout design for various applications. Some benefits refer to maintaining and/or meeting timing constraints for registers if the propagation delay through the barrel register logic is constrained. Using double-buffer operation, the mask may be properly applied to the right phase and also the circuit maintains half-a-cycle for the propagation through the barrel shifter and the SR latch setup time. The 4th phase of the DLL may trigger the bits 3:0 of the mask, giving the 5th phase ⅛th of the period for the TDC to perform droop measurement, and giving half the period for information to propagate through a few logic gates and setup the DFF input. Then, register output of the mask_phi1 will only be used half-a-cycle later to thereby allow enough time for setting-up of the masking AND gates without glitches. Also, for a given droop measurement, less than one full phase rotation is needed before stretching the clock. For instance, if the TDC acquires a voltage droop at measurement at 0, and the clock cycle starts at $\pi/4$ (mask bit is on 10'b00_0000_0001), then the mask bit will be shifted at $\pi+\pi/4$, and a next rising edge of the clock will appear when the Phi_DDL[1] on-time signal is active, e.g., at $2\pi+\pi/2$, after the TDC started acquiring the droop. Moreover, at $2\pi+\pi/4$ after the previous rising edge, the clock cycle has therefore been stretched by $\pi/4$, e.g., making the cycle 12.5% longer, or a reduction of a bit more than 10% of clock frequency of the CPU/GPU almost without latency.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include first circuitry that receives a clock signal and provides one or more phase-shifted pulse signals based on the clock signal. The device may include second circuitry that receives an input voltage, receives the clock signal, and provides an internal control signal based on the input voltage and the clock signal. The device may include third circuitry that receives the internal control signal, receives the one or more phase-shifted pulse signals, and provides an output clock signal based on the internal control signal and the one or more phase-shifted pulse signals.

Described herein are various implementations of a device. The device may have a digital locked loop that provides pulse signals with shifted phases. The device may have a droop detector that detects a voltage droop in a core voltage signal and provides an internal control signal based on detecting the voltage droop in the core voltage signal. The device may have a phase shifter that receives the internal control signal from the droop detector, receives the pulse signals from the digital locked loop, stretches frequency of the internal control signal via rotating phase selection of the shifted phases of the pulse signals, and provides an output clock signal based on the stretched frequency of the internal control signal.

Described herein are various implementations of a method. The method may generate one or more pulse signals with shifted phases, detect a voltage droop in a core voltage signal, and provide an internal digital clock signal based on detecting the voltage droop in the core voltage signal. The method may stretch frequency of the internal digital clock signal via rotating phase selection of the shifted phases of the pulse signals, and also, the method may then provide an output digital clock signal based on the stretched frequency of the internal control signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
   first circuitry that receives a clock signal and provides one or more phase-shifted pulse signals based on the clock signal;
   second circuitry that receives an input voltage, receives the clock signal, and provides an internal control signal based on the input voltage and the clock signal;
   third circuitry that receives the internal control signal, receives the one or more phase-shifted pulse signals, and provides an output clock signal based on the internal control signal and the one or more phase-shifted pulse signals; and
   a phase locked loop circuit that receives a reference clock from an external source, generates a phase locked loop clock signal, and then provides the phase locked loop clock signal to the first circuitry and the second circuitry.

2. The device of claim 1, wherein:
   the first circuitry refers to a digital locked loop circuit that receives the clock signal as the phase locked loop clock signal, the second circuitry refers to a droop detection circuit that receives the input voltage as a core voltage and provides the internal control signal as a digital internal control signal, the third circuitry refers to a phase shifter circuit that provides the output clock signal as a digital output clock signal.

3. The device of claim 2, wherein the droop detection circuit receives the core voltage from an external supply, receives the phase locked loop clock signal from the phase locked loop circuit, generates the digital internal control signal based on the core voltage and the phase locked loop clock signal, and then provides the digital internal control signal to the phase shifter circuit.

4. The device of claim 2, wherein:

the phase shifter circuit is configured to operate as a rotating phase selector circuit for intelligent clock stretching of high performance digital circuits, and the one or more phase-shifted pulse signals refer to multiple phase-shifted pulse signals with each phase-shifted pulse signal having a shifted phase with respect to each other phase-shifted pulse signal.

5. The device of claim 2, further comprising:

a post scalar output circuit that receives the digital output clock signal from the phase shifter circuit, generates a scaled digital output clock signal based on the digital output clock signal, and provides the scaled digital output clock signal to an external computing device.

6. The device of claim 5, wherein the external computing device refers to a processor for use with at least one of a central processing unit (CPU) and a graphics processing unit (GPU), and wherein the scaled digital output clock signal refers to a CPU clock signal or a GPU clock signal for the processor.

7. The device of claim 6, wherein the device operates as flexible clocking circuitry that is configured to generate the CPU clock signal or the GPU clock signal for the CPU that allows for reduction of a voltage margin of the core voltage by automatically slowing down the CPU clock or the GPU clock when a large voltage transient occurs in the core voltage.

8. The device of claim 6, wherein the device operates as flexible clocking circuitry that is configured to lower a clock frequency of the CPU clock or the GPU clock when a voltage droop starts to occur in the core voltage, and when current to the CPU or GPU drops, the device reduces the voltage droop in the core voltage.

9. The device of claim 6, wherein the device operates as flexible clocking circuitry that is configured to momentarily reduce digital circuit speed of the CPU or the GPU by lowering clock frequency of the CPU clock or the GPU clock when a voltage droop occurs in the core voltage.

10. A device, comprising:

a digital locked loop that provides pulse signals with shifted phases;

a droop detector that detects a voltage droop in a core voltage signal and provides an internal control signal based on detecting the voltage droop in the core voltage signal;

a phase shifter that receives the internal control signal from the droop detector, receives the pulse signals from the digital locked loop, stretches frequency of the internal control signal via rotating phase selection of the shifted phases of the pulse signals, and provides an output clock signal based on the stretched frequency of the internal control signal, and a phase locked loop that receives a reference clock from an external clocking source, generates a phase locked loop clock signal, and provides the phase locked loop clock signal to the digital locked loop and droop detector.

11. The device of claim 10, wherein the pulse signals refer to multiple consecutive phase-shifted pulse signals with each phase-shifted pulse signal having a shifted phase with respect to each other phase-shifted pulse signal.

12. The device of claim 10, wherein the droop detector receives the core voltage signal from an external supply, receives the phase locked loop clock signal from the phase locked loop, generates the internal control signal based on the core voltage signal and the phase locked loop clock signal, and provides the internal control signal to the phase shifter.

13. The device of claim 10, wherein the digital locked loop receives the phase locked loop clock signal from the phase locked loop, generates the pulse signals with the shifted phases based on the phase locked loop clock signal, and provides the pulse signals as phase-shifted pulse signals to the phase shifter.

14. The device of claim 10, further comprising:

a post scalar output circuit that receives the output clock signal from the phase shifter, generates a scaled output clock signal based on the output clock signal, and provides the scaled output clock signal to an external computing device.

15. A method, comprising:

generating pulse signals with shifted phases;

detecting a voltage droop in a core voltage signal;

providing an internal digital clock signal based on detecting the voltage droop in the core voltage signal;

stretching frequency of the internal digital clock signal via rotating phase selection of the shifted phases of the pulse signals;

providing an output digital clock signal based on the stretched frequency of the internal control signal;

generating a phase locked loop clock signal based on a reference clock signal; and generating the internal digital clock signal based on the core voltage signal and the phase locked loop clock signal.

16. The method of claim 15, wherein the pulse signals refer to multiple consecutive phase-shifted pulse signals with each phase-shifted pulse signal having a shifted phase with respect to each other phase-shifted pulse signal.

17. The method of claim 15, further comprising:

generating the pulse signals with the shifted phases based on the phase locked loop clock signal; and generating a scaled output digital clock signal based on the output digital clock signal for an external computing device.

* * * * *